(12) United States Patent
Joubert et al.

(10) Patent No.: US 9,378,970 B2
(45) Date of Patent: Jun. 28, 2016

(54) PLASMA ETCHING PROCESS

(71) Applicants: COMMISSARIAT A L'ENERGIE ATOMIQUE ET AUX ENE ALT, Paris (FR); CNRS Centre National de la Recherche Scientifique, Paris (FR)

(72) Inventors: Olivier Joubert, Meylan (FR); Gilles Cunge, Fontaine (FR); Emilie Despiau-Pujo, Grenoble (FR); Erwine Pargon, Grenoble (FR); Nicolas Posseme, Grenoble (FR)

(73) Assignees: COMMISSARIAT A L'ENERGIE ATOMIQUE ET AUX ENERGIES ALTERNATIVES, Paris (FR); CNRS Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 14/610,490

(22) Filed: Jan. 30, 2015

(65) Prior Publication Data

US 2015/0228495 A1    Aug. 13, 2015

(30) Foreign Application Priority Data

Jan. 31, 2014   (FR) ..................................... 14 50781

(51) Int. Cl.
*H01L 21/302* (2006.01)
*H01L 21/3065* (2006.01)
(Continued)

(52) U.S. Cl.
CPC ...... *H01L 21/3065* (2013.01); *H01L 21/31116* (2013.01); *H01L 21/67069* (2013.01)

(58) Field of Classification Search
CPC ............ H01L 21/3065; H01L 21/3116; H01L 21/67069; H01J 37/32036; H01J 37/32045; H01J 37/32082; C23C 16/52; C23C 16/45536; C23C 16/45544
USPC ............................... 438/714, 709; 216/37, 67
See application file for complete search history.

(56) References Cited

U.S. PATENT DOCUMENTS

| 2002/0160125 A1 | 10/2002 | Johnson et al. | |
| 2011/0139748 A1* | 6/2011 | Donnelly .......... | H01J 37/32036 216/37 |

OTHER PUBLICATIONS

French Preliminary Search Report and Written Opinion issued Jul. 10, 2014 in Patent Application No. FR 1450781 (with English translation of categories of cited documents).

(Continued)

*Primary Examiner* — Duy Deo
*Assistant Examiner* — Maki Angadi
(74) *Attorney, Agent, or Firm* — Oblon, McClelland, Maier & Neustadt, L.L.P

(57) ABSTRACT

A method and system are provided for etching a layer to be etched in a plasma etching reactor, including: forming a reactive layer by injection of at least one reactive gas to form a reactive gas plasma, which forms, together with the layer to be etched, a reactive layer which goes into the layer to be etched during etching of said layer to be etched, wherein the reactive layer reaches a steady state thickness upon completion of a determined duration of said injection; said injection being interrupted before said determined duration has elapsed so that, upon completion of the forming of the reactive layer, the thickness of the reactive layer is smaller than said steady state thickness; and removing the reactive layer by injection of at least one inert gas to form an inert gas plasma, which makes it possible to remove only the reactive layer.

32 Claims, 11 Drawing Sheets

(51) Int. Cl.
*H01L 21/311* (2006.01)
*H01L 21/67* (2006.01)

(56) References Cited

OTHER PUBLICATIONS

Dominik Metzler, et al., "Fluorocarbon assisted atomic layer etching of $SiO_2$ using cyclic $Ar/C_4F_5$ plasma" Journal of Vacuum Science & Technology A, vol. 32, No. 2, XP055128131, 2014, 5 pages.

K. K. Ko, et al., "Controllable layer-by-layer etching of III-V compound semiconductors with an electron cyclotron resonance source" Journal of Vacuum Science and Technology B, vol. 11, No. 6, XP055127497, 1993, pp. 2275-2279 and cover page.

Ankur Agarwal, et al., "Plasma atomic layer etching using conventional plasma equipment" Journal of Vacuum Science and Technology A, vol. 27, No. 1, XP012128832, 2009, pp. 37-50.

Satish D. Athavale, et al., "Realization of atomic layer etching of silicon" Journal of Vacuum Science and Technology B, vol. 14, No. 6, 1996, pp. 3702-3705.

\* cited by examiner

PRIOR ART

PLASMA ETCHING PROCESS

TECHNICAL FIELD OF THE INVENTION

The present invention generally relates to dry etching techniques used in microelectronics and more particularly concerns the improvement of accuracy in this type of etching using plasma.

STATE OF THE ART

The constant reduction in the dimensions of the patterns required to be etched to produce always denser integrated circuits could be sustained only by constantly improving the techniques of photolithography and etching of the layers of materials used to produce the electronic integrated circuits and all sorts of other devices of micrometric or nanometric sizes combining optical and mechanical devices.

After having long used so-called "wet etching" wherein the substrates to be etched are immersed into an appropriate solution, capable of chemically reacting with the material to be etched and to dissolve it, the microelectronics industry has used so-called "dry etching" for many years. Such etching is obtained by ionic bombardment of the target to be etched using plasma formed in an etching chamber. As the ionic bombardment is essentially perpendicular to the surfaces to be etched, little or even no side etching occurs in the material to be etched, in the optimum implementing conditions, and the critical dimensions (CD) of the devices to be produced can thus be more easily obtained. The main advantage of such type of etching is that it can thus be highly anisotropic.

However, plasma etching must be able to take up always more difficult challenges to face the introduction of new families or technological "nodes", specifically beyond the so-called "22 nm" nodes. Executing patterns of the order of ten nanometers (nm) then raises the problem of the intrinsic etching precision which can be obtained from plasma. The main difficulty relates to the selectivity of etching at the boundary between the layers of different materials which the devices to be produced are made of. This is illustrated in FIG. 1 which shows the surface layer 110 of a material 100 which is being etched and the atomic structure of which is significantly disturbed by the plasma ions bombardment 120 from its surface 101.

As a matter of fact, etching with plasma is characterized in that it is generally advantageous to transmit the ions hitting the target a significant energy in order to obtain a high etching velocity and thus short etching times compatible with the criteria of implementation of an industrial production method. However, such high energy results in the generation of a so-called reactive disturbed layer 110, which has a high thickness as relates to etching accuracy desired to be obtained at the considered integration levels, i.e. for the technological nodes beyond the 22 nm one. Such reactive layer 110 is usually several nanometers thick and may even be a few dozens of nanometers thick.

FIGS. 2a to 2e illustrate the problems arising when plasma-etching electronic components with decananometric dimensions, essentially MOSFET type transistors, the acronym for « metal-oxide-semiconductor field effect transistor» which are the main components of integrated circuits and other devices produced by the microelectronics industry.

FIG. 2a illustrates the problem more specifically arising when producing plan MOSFET transistors of the FDSOI type, an acronym which refers to a technological method widely used for producing transistors with conduction channels which may have no carrier at all, also called « fully depleted» (FD) transistors. To obtain this result, elaborate substrates of the « silicon on insulator» (SOI) type on the surface of which the transistors are produced from a thin layer of single-crystal silicon 210 are then used.

Plasma-etching 120 the gate electrodes of the FDSOI transistors is particularly delicate. The material(s) 100 forming the gate 220 must be etched on either side of a so-called « hard mask» 230 which defines their horizontal geometry. It must be possible to stop the etching, in such case, on a thin layer of oxide 240 of about one nanometer, or even less, which has been formed on the single-crystal layer 210 and without damaging the latter. As a matter of fact, it is particularly important for the subsequent steps not to disturb the single-crystal structure of the layer 210 exposed to etching and to leave a sufficient thickness.

FIG. 2b illustrates another problem which arises with plasma etching when producing another type of MOSFET transistors the three-dimensional (3D) 200 structure of which has been developed more specifically for the decananometric technological nodes. Such transistors are called « FinFET», the acronym referring to the structure of their conduction channel 260 which has the shape of a vertical « fin». In this case, a problem arises, specifically upon etching the gate, on the one hand 290 and the spacers on the other hand. When etching the grate, which must be perfectly anisotropic, the etching must stop at the top of the FIN, while going on until the silicon substrate is reached. When the etching reaches the base of the structure, the complete removal of the residues at the corners of the structures may require a very long overetching time (70-100%) during which the FIN top is protected by a very thin oxide layer only. The "spacers" 250 must be then formed on either side of the gate. Like the etching of the gate, the etching of the spacers requires a spot etching method which must minimize the side etching of the spacer without damaging the FIN top. Very long overetching times (between 200 and 400%) are also required for removing the nitride residues at the foot of the FIN. The risk of damaging the FIN top is real. The problem arising during the production of such three-dimensional structure consists in not damaging the rectangular geometrical shape, and more particularly the corners 280 of the FIN, at the risk of severely affecting the performances of such type of transistors, the electric characteristics and behaviour of which are directly dependent on the shapes of the channel and of the surrounding gate 290.

The edges of the "fins" must also form angles which must be as right as possible with the layer whereon such "fins" are supported, typically the silicon layer.

FIGS. 2c to 2d illustrate the very undesirable effects of a reactive layer 110 having a much higher thickness than that of the oxide layer 240 which should ideally be used as a stop for the etching. Such figures show the progress 122 of the reactive layer 110 into the material to be etched 100. For clarity, the reactive layer 110 is shown in FIGS. 2c to 2d by a texture representing a disturbed atomic structure. The respective dimensions of the various layers are of course not shown at scale in these figures.

As shown in FIG. 2d, the reactive layer 110 may reach the oxide layer 240 and then go therethrough, as shown in FIG. 2e, thus causing the undesired etching 212 of the underlying layer 210 of single-crystal silicon.

FIG. 3 is a picture taken with an electronic microscope of a section through a transistor of the FDSOI type etched under the above-mentioned conditions and which illustrates the problems met during a standard plasma etching. This picture shows the thin surface layer 210 of single-crystal silicon wherein a very significant removal 212 can be seen in this layer, which results from the etching of the gate electrode 220.

The removal here results from the anisotropic etching of the gate spacers 250 which are traditionally made of silicon nitride and remained in place on the gate flanks.

To remedy the undesired effects of too thick a reactive layer which is formed in the material to be etched located in a standard etching plasma, it must be possible to significantly reduce the thickness thereof while trying not to too seriously affect the etching parameters, such as etching anisotropy, accuracy and time.

FIGS. 4a and 4b illustrate an exemplary target for the reduction in the thickness of the reactive layer to be aimed at to give the etching method the properties required for actually obtaining a sufficiently accurate etching for the decananometric technological nodes beyond the one currently in production, i.e. the 22 nm one. FIG. 4a shows the thickness of the reactive layer 110 formed on the standard silicon surface obtained with a low ion bombardment. In this example, it amounts to 3.5 nm and it is obtained by transmitting to the ions an energy ranging from 15 to 30 electrons-volts (eV) typically in plasma of the ICP type, the acronym for « inductively coupled plasma» wherein an induction coil surrounding the etching chamber maintains plasma. Such result is additionally obtained by not applying a "bias" voltage to the silicon plate whereon the devices are produced.

To reach this goal, the reactive layer 110 must be very significantly reduced down to a thickness of less than 1 nm, as shown in FIG. 4b. A so-called atomic precision etching can thus be obtained, wherein a few layers only of the material to be etched are disturbed by the forming of a reactive layer. It must also be possible to keep a displacement of the etching front, and thus an etching speed, compatible with the implementation of an industrial process in a production line.

Several solutions have been considered for etching a very thin layer.

To implement an atomic etching, an etching method well-known to the persons skilled in the art exists, which is called ALET, the acronym for « atomic layer etching» i.e. « etching of a material, layer per layer» wherein etching cycles are repeated, which are self-restrictive and remove only one atomic layer per cycle Such an etching method is for example disclosed in an article published in 1996 in the « Journal of American Vacuum Society» entitled « Realization of atomic layer etching of silicon» (J. Vac. Sci. Technol. B 14(6), November/December 1996). Each cycle may comprise up to four steps during which gaseous adsorption reactant is firstly introduced into the etching chamber. For example, chlorine (Cl) is introduced when etching silicon. Excess chlorine is then drained and the reactive which has been adsorbed is then exposed to an ionic bombardment. The etching products such as the silicon-chlorine radicals (SiCl) are then discharged, and the above cycle can then be repeated. Such a technique, which is essentially implemented in laboratories for developing new products is intrinsically long. 150 seconds are typically required for executing each cycle. This method is so long that it is not industrialized.

A low « electronic temperature» plasma, i.e. a plasma wherein the temperature of the electrons is of the order of 0.5 eV can also be used for obtaining an atomic etching. In this type of plasma the ions which bombard the surface to be etched acquire energy of the order of 5 eV only, or even less, which makes it possible to limit the reactive layer to a very low thickness. This type of method using a low electronic temperature plasma however has two major drawbacks. The first one is that low energy ions may deposit and form polymers. The other disadvantage is that the directionality of low energy ions is not as important. Etching is not as anisotropic as it used to be with high energy ions and complying with the critical dimensions (CD) of transistors with a decananometric size thus becomes difficult. Etching with a low electronic temperature plasma is therefore not considered as a solution industrially viable at such integration level.

So-called pulsed plasma is also known, which makes it possible to obtain a reactive layer having a low thickness, i.e. less than 1 nm, as desired. No bias is either applied to the target, i.e. to the substrate or the wafer to be etched in such type of plasma, and the source is pulsed with a low duty cycle. Plasma is thus turned ON and OFF at a quick rate (between a few hundreds of Hz and a few kHz). The ratio of durations between the ON and OFF times is the duty cycle. A 20% duty cycle means that plasma is on for 20% of the period duration. In such conditions, the energy transmitted to the ions is lower than when plasma is continuously operated, but the etching speed also becomes very low and does not meet the industrial expectations. Typically dozens or even hundreds of seconds are then necessary to etch for instance 1 nm of polycrystalline silicon.

As described above, the known solutions for executing etching operations while very accurately controlling the stopping of etching all have drawbacks.

The aim of the present invention is thus to describe a method for etching which at least partly remedies the disadvantages of the known processes making it possible to execute precise etching operations.

Other objects, characteristics and advantages of the present invention will become apparent upon examining the following description and the appended drawings. It is understood that other advantages may be included.

SUMMARY OF THE INVENTION

According to one embodiment, the invention relates to a method for etching a layer to be etched in a plasma etching reactor, with such method comprising:
  an initial phase comprising:
    at least one initial step of etching, with the initial step of etching comprising, for a duration D0, an injection into the reactor of at least one reactive gas to form a reactive gas plasma, with the reactive gas plasma forming, together with the layer to be etched, a reactive layer 110 which goes into the layer to be etched, with the duration D0 being longer than a determined duration Ds of injection, upon completion of which the reactive layer 110 reaches a steady state thickness, so that the thickness of the reactive layer 110 can reach said steady state thickness during said initial step of etching;
    at least one step of removing the reactive layer 110, formed upon completion of the initial step of etching;
  with the method comprising, after the initial phase, a subsequent phase including at least a sequence of steps, with each sequence including at least the following steps:
    for a duration D1, an injection 710 into the reactor of at least one reactive gas to form a reactive gas plasma, with the reactive gas plasma forming, together with the layer to be etched, a reactive layer 110 which goes into the layer to be etched, with the duration D1 of injection being shorter than the determined duration Ds of injection upon completion of which the reactive layer 110 would reach a steady state thickness, so that, during the subsequent phase, the thickness of the reactive layer 110 remains smaller than said steady state thickness;
    at least one step of removing 720 the reactive layer 110, formed upon completion of the injection performed during the duration D1, with the removing step 720 comprising injecting at least one inert gas into the reactor to form an inert gas plasma making it possible to remove the reactive layer 110 only, formed upon completion of the injection performed during the duration D1.

The initial phase thus makes it possible to quickly etch the layer to be etched and the subsequent phase of etching is triggered when the thickness of the layer to be etched is reduced and when the free face of the layer to be etched gets close to the underlying layer. The subsequent phase is started soon enough for the underlying layer not to be affected. If the underlying layer is made of single-crystal silicon, the single-crystal silicon underlying layer will not be undesirably be etched.

The method thus enables an improved accuracy while ensuring a sufficiently high speed to be industrialized.

Optionally, the invention may further have at least any one of the following steps and characteristics which may be taken into account separately or in combination:

the subsequent phase comprises a plurality of sequences of steps.

The layer to be etched is on the top of an underlying layer, and wherein the initial phase is interrupted and the subsequent phase is started when the layer to be etched has a thickness greater than the steady state thickness of the layer. The initial step of etching is thus stopped before the reactive layer reaches a sufficient thickness to disturb the underlying layer. As a matter of fact, during the subsequent phase, the thickness of the reactive layer is smaller than the steady state thickness. The stoppage of the etching is thus precisely controlled and any interference of the reactive layer with the underlying layer is thus avoided. The latter is thus preserved.

The initial phase is interrupted and the subsequent phase is started when the layer to be etched has a thickness greater than the steady state thickness of the layer and smaller than k times the steady state thickness of the layer, with k ranging from 8 to 2.

The initial phase thus makes it possible to quickly etch the layer to be etched and the subsequent phase of etching is triggered when the thickness of the layer to be etched is reduced and when the free face of the layer to be etched gets close to the underlying layer. The subsequent phase is started soon enough for the underlying layer not to be affected.

According to one embodiment, k ranges from 6 to 3.

According to a preferred embodiment, k=4. This enables a high velocity of the method while reducing the risk of damaging the underlying layer.

According to one embodiment, the invention relates to a method for etching a layer to be etched in a plasma etching reactor, with such method comprising at least one sequence of steps including at least:

a step of forming a reactive layer comprising an injection into the reactor of at least one reactive gas to form a reactive gas plasma, with the reactive gas plasma forming, together with the layer to be etched, a reactive layer which goes into the layer to be etched when and as the layer to be etched is etched, and wherein the injection of at least one reactive gas is interrupted before a determined duration of injection has elapsed, after which the reactive layer would have reached a steady state thickness, so that upon completion of the injection of at least one reactive gas, the thickness of the reactive layer is less than said steady state thickness.

The sequence of steps preferably comprises at least one step of removing the reactive layer, with the removing step comprising injecting at least one inert gas into the reactor to form an inert gas plasma making it possible to remove the reactive layer only.

The step of etching thus comprises the injection, into the etching reactor, of at least one reactive gas for a determined duration unlike the methods of the prior art wherein the reactive gas is continuously injected into the etching reactor. In the methods of the prior art, and thus when gas is continuously injected into the reactor, the reactive layer reaches a steady state thickness, after a determined time, which will control the etching method. In such methods of etching using a continuous injection of gas, the steady state thickness reached by the reactive layer and the time upon which said steady state thickness is reached depends on the plasma parameters. Such time upon which the steady state thickness is reached is referred to as Ds. When the injection of the reactive gas is limited in time, the thickness of the reactive layer can be controlled and its thickness which is smaller than the steady state thickness is reached when gas is continuously injected.

To minimize the thickness of the reactive layer, the injection of the reactive gas must be interrupted before the reactive layer reaches its steady state thickness when the reactive gas is continuously injected. The steady state thickness is typically the maximum thickness of the reactive layer when the reactive gas(es) is/are continuously injected, i.e. typically when it/they is/are injected for a few seconds or a few minutes.

The step of forming the reactive layer is executed according to parameters which would have enabled the reactive layer to reach a steady state thickness when the duration Ds determined for injecting the reactive gas has elapsed.

Using inert gas makes it possible to physically pulverize the reactive layer during the preceding step without encouraging the forming of the reactive layer.

The invention thus makes it possible to control the formation dynamics of the reactive layer. The formation of such layer is stopped before it reaches a steady state thickness which it would reach if the reactive gas was continuously injected.

The invention thus enables a very accurate control of the thickness of the reactive layer and to stop the etching accordingly. Consequently, the invention makes it possible to improve the etching precision. The invention typically makes it possible to control etching with an atomic precision and to stop etching on extremely thin layers having a thickness of less than 1 nm without damaging the underlying layers.

Then, when etching is executed with a barrier layer, the thickness of the reactive layer is controlled so that its thickness remains smaller than or equal to a thickness beyond which it goes through the barrier layer and disturbs the underlying layer.

Besides, the invention makes it possible to preserve the high anisotropy of plasma etching. It may additionally have an etching velocity compatible with industrial application, for instance if the etching speed reached during the steps wherein the reactive gas is injected is high and if the frequency of the cycles of injection of reactive gas/inert gas is high.

According to another embodiment, the invention provides for a method for etching a layer to be etched in a plasma etching reactor, with the method comprising at least one step of forming a reactive layer, with such step comprising an injection into the reactor of at least one reactive gas to form a reactive gas plasma able to etch the layer to be etched, characterized in that the injection of at least one reactive gas is executed for a duration of less than 1,000 milliseconds, preferably less than 500 milliseconds, preferably less than 200 milliseconds and preferably less than 100 milliseconds. The method preferably comprises at least one step of removing the reactive layer, with the removing step comprising injecting at least one inert gas into the reactor to form an inert gas plasma making it possible to remove the reactive layer. The step of removal is preferably executed at least partially after the step of forming the reactive layer.

According to still another embodiment, the invention provides for a method for etching a layer to be etched in a plasma etching reactor, with the method comprising at least one step of injection of at least a reactive gas into the reactor so as to form a reactive gas plasma able to etch the layer to be etched, characterized in that the injection of at least one reactive gas is executed for a duration of less than 1 second, preferably less than 500 milliseconds, preferably less than 200 milliseconds and still preferably less than 100 milliseconds. The method comprises at least one step of removing, preferably executed after the step of etching, comprising the injection of at least one inert gas into the reactor to form an inert gas plasma. The inert gas is preferably injected for less than 500 milliseconds and preferably less than 100 milliseconds.

Optionally, the invention may further have at least any one of the following steps and characteristics which may be taken into account separately or in combination:

Advantageously, the duration D1 of the injection of the reactive gas ranges from 50 to 1,000 ms and preferably from 50 to 500 ms.

Advantageously, the duration D1 of the injection of the reactive gas is interrupted when the thickness of the reactive layer ranges from 0.5 to 2 nm and preferably from 0.5 to 1 nm, and preferably less than 1 nm and more generally less than 2 nm.

According to one embodiment, the layer to be etched is on a barrier layer and the duration D1 of the injection of the reactive gas must be so estimated that the thickness of the reactive gas is smaller than the thickness of the barrier layer. The duration of the injection of the reactive gas is interrupted before the thickness of the reactive layer is greater than the thickness of the barrier layer.

Advantageously, the duration of injection of the inert gas is less than 1 second, preferably less than 500 milliseconds and most preferably ranges from 50 ms to 200 ms. According to one embodiment, the duration of injection of the inert gas ranges from 50 to 500 ms and preferably from 100 to 500 ms. The duration of the inert gas plasma thus complies with these intervals.

According to one embodiment, during the step of forming a reactive layer during the subsequent phase, at least one of the following parameters is adjusted so as to control the forming of the reactive layer: the duration D1 of injection of the reactive gas and the energy transmitted to the ions in the reactive gas plasma. The other parameters of the plasma and the etching chemistry remain identical with the conditions of the method using the continuous injection of etching gas.

During the step of etching, at least one of the following etching parameters is preferably adjusted so as to control the forming of the reactive layer: the duration D1 of the injection of the reactive gas, the pressure of plasma, the reactive gas rates, the density of the reactive gas plasma (by adjusting the RF power injected into plasma), the energy transmitted to the ions of the reactive gas plasma (by adjusting the bias power applied to the substrate support). During the step of etching, said etching parameters are preferably maintained similar to the conventional parameters for etching the material. The energy transmitted to the ions of the reactive gas plasma during the step of injection of reactive gas is below 100 eV and preferably below 50 eV and more preferably below 25 eV and the density of the reactive gas plasma ranges from $10^{10}$ to $5.10^{11}$ ions/cm$^3$ and preferably from $10^{10}$ to $10^{11}$ ions/cm$^3$. Such values of the ion density and ion energy should make it possible to minimize the thickness of the reactive layer formed during the first step and to maintain the thickness thereof below a value of the order of 1 nm. If the results obtained show that the reactive layer is too thick (excessive consumption of an underlying layer, for instance, or consumption of the substrate if etching is stopped on a substrate or excessive consumption of an etching barrier layer), the parameters of the plasma can be modified or the time required for the injection of the reactive gas can be reduced.

During the step of removing the reactive layer, at least one of the following parameters is advantageously adjusted so as to remove the reactive layer without removing the layer to be etched which has not been modified during the step of injecting the reactive gas: the duration of injection of the inert gas(es), the density of the inert gas plasma, the energy transmitted to the ions of the inert gas plasma. The energy transmitted to the ions of the inert gas plasma is so adjusted as not to pulverize the material of the layer to be etched, nor modify same. More generally, the parameters for the injection of inert gas are so determined as not to modify the material under the reactive layer formed during the step of forming the reactive layer (thus the material which has not been modified during the step of injecting the reactive gas). The inert gas thus does not etch the material to be etched. The inert gas has no chemical reaction with the material to be etched. The energy transmitted to the ions of the inert gas plasma is preferably below 500 eV and preferably below 100 eV and more preferably below 50 eV and still preferably below 30 eV and even preferably below 25 eV.

The inert gas plasma formed during the step of removing the reactive layer is advantageously continuous to pulverize the reactive layer more quickly. In the continuous mode, the energy transmitted to the ions of the inert gas plasma is below 50 eV, preferably below 30 eV and more preferably below 25 eV. The reactive layer can thus be pulverized without damaging the underlying layer. Alternately, the inert gas plasma is pulsed (the plasma excitation source power and the substrate bias power may be synchronously pulsed).

According to one embodiment, the inert gas plasma formed during the step of removing the reactive layer is pulsed plasma and the energy transmitted to the ions of the inert gas plasma is less than 50 eV and preferably less than 25 eV.

According to one particular embodiment, a radiofrequency (RF) bias is applied to the substrate which supports the layer to be etched. This makes it possible to accelerate the removing of the reactive layer by transmitting energy to the ions which bombard the substrate. The bias power advantageously ranges from 0 to 500 W, preferably from 0 to 100 W and preferably from 0 to 20 W.

An inert gas only, or a mixture containing inert gases only is advantageously injected during the step of removing the reactive layer.

According to one particular embodiment, an inert gas or a mixture of inert gases, in addition to the reactive gas, is injected during the step of forming the reactive layer. As a matter of fact a mixture of inert gas may be injected when injecting a reactive gas. A continuous flow of inert gas thus remains in the reactor and the injection of the reactive gas into plasma only is pulsed.

According to one embodiment, said removing step comprising an injection of at least one inert gas into the reactor is executed continuously and simultaneously with a plurality of said injections of at least one reactive gas. The reactive gas(es) is/are thus injected in a pulsed or discontinuous way and the inert gas(es) is/are injected continuously. According to an alternative solution, the reactive gas(es) is/are injected in a pulsed or discontinuous way and the inert gas(es) is/are thus injected in a pulsed or discontinuous way. Reactive and inert gas injection is then executed alternately.

The reactive gas is able to etch the material in a plasma reactor. According to one particular embodiment, the reactive gas is selected among all the reactive gas or mixtures of reactive gas enabling to etch the material desired to be etched. Such selection is totally identical with an etching method wherein gases are continuously injected into the etching chamber. In other words, the whole knowledge in the field of plasma etching can be applied, the etching gas/material to be etched couple remains unchanged. The parameter which is advantageously changed within the scope of the invention is the time of injection of the reactive gas into the reactor as compared to the situation where it is typically continuously injected.

According to one embodiment, the reactive gas is selected among chlorine Cl2, HBr, SF6, NF3, SiCl4, BCl3, H2, SiF4, O2, HCl, HI, CH2F2, CHF3 Ar or a mixture of such gases for the front end processes.

According to one embodiment, the reactive gas is selected among CF4, CHF3, CH3F, C4F8, CH2F2, C4F6, C5F6, Ar, O2, He or any other reactive gas used for etching dielectrics.

According to one embodiment, the inert gas is a rare gas or a mixture of rare gases.

According to one embodiment, the inert gas is argon (Ar), xenon (Xe) or a mixture of such gases.

According to one particular embodiment, the layer to be etched is made of a semiconductor material or a metal or a dielectric material having a high permittivity or any other layer of material included in a stack of complex materials used for producing transistors or interconnections making it possible to produce a microelectronic device. Such concept of injecting gas for a controlled time (pulsed injection of gas) is general and may be applied to any etching method using plasma, on any material. In some cases, pulsed reactive gas is of no interest whereas, in other cases and more particularly when the etching precision must be controlled within 1 nm, the time during which the reactive gas is injected will have to be controlled. The layer to be etched if preferably made of a semiconductor material selected among: silicon (Si), germanium (Ge) or silicon-germanium (SiGe) or InGaAs, or graphene, or $MoS_2$ or a thin layer based on III-V materials or a metal layer or a layer of porous dielectric materials. The layer to be etched may also be a metal selected among Ti, Ta, TaN, TiN, W, Cu or any metal which may be implied in a microelectronic device. The layer to be etched may be a dielectric material having a high permittivity like $HfO_2$, $Al2O3$, HfSiON, $ZrO_2$, $Y2O3$ etc. . . . The layer to be etched may also be an oxide, or a nitride or an oxynitride or a dielectric material having a low permittivity or still a polymer material like a photoresist (a 193 nm resin or a EUV resin). All the layers mentioned above may be thin flat layers or layers deposited onto complex three-dimension structures.

According to one embodiment, the layer to be etched is the layer in a MOSFET transistor.

According to one embodiment, said sequence of steps is executed several times.

According to one embodiment, the reactive gas and/or the inert gas is different between at least two sequences of steps.

The steps of injecting reactive gas into the layer to be etched and removing the reactive layer are advantageously executed in the same plasma reactor, which simplifies the process.

The plasma reactor is a standard plasma reactor. Advantageously, the invention requires no specific plasma reactor but a specific gas panel making it possible to inject gas for the appropriate times (enabling to pulse the injection of gas into the etching reactor).

According to a particular embodiment, the layer to be etched may be flat or deposited onto patterns.

Several sequences of steps are preferably carried out. This enables a particularly accurate control of the depth of the progress of the reactive layer into the material to be etched.

According to a particular embodiment, prior to the sequence of steps, a step of initial etching is executed, with the step of initial etching comprising the injection of at least one reactive gas into the reactor so as to form an initial reactive gas(es) plasma, with the duration of injection (D0) being longer than the determined duration Ds so that the thickness of the reactive layer can reach said steady state thickness. This makes it possible to execute etching according to the conventional etching mode, wherein gas is injected continuously and thus quickly, during which the reactive layer has a maximum thickness, and then to implement the sequence of steps making it possible to limit the thickness of the reactive layer when necessary only, i.e. if the plasma must selectively land on a very thin layer having a nanometric thickness. If the thickness of the material to be etched is a few dozens of manometers or a few micrometers or even more than this, such step of approach will advantageously be executed, as it enables a quick conventional etching in typical plasma conditions (with no pulsed injection of the reactive gas), and then, when the material is etched on an almost complete thickness, said sequence of steps, with a pulsed injection of gas is implemented.

In the present patent application, the thickness of the reactive layer is taken in a direction perpendicular to the main plane wherein the substrate extends, i.e. parallel to the privileged direction of the anisotropic etching.

According to another embodiment, the invention relates to a system for implementing the method according to the invention, with the system comprising: a plasma etching reactor; an injection device so configured as to inject, preferably alternately, at least two gases into the plasma etching reactor, with the injection device being so configured as to be able to inject at least one such gas for a time of less than 1,000 milliseconds and preferably less than 500 milliseconds and more preferably less than 100 milliseconds.

The system thus makes it possible to form a pulsed reactive gas plasma in the reactor alternately with inert gas plasma. The injection device thus makes it possible to inject a first gas or a first mixture of gas into the plasma reactor, and then to interrupt such injection after a very short time, beyond which a second gas or a second mixture of gas is injected for an also very short time. The system is so configured as to be able to repeat this sequence as many times as required.

BRIEF DESCRIPTION OF THE FIGURES

The goals and objectives as well as the characteristics and advantages of the invention will better emerge from the detailed description of an embodiment of the latter which is illustrated by the following appended drawings wherein.

The drawings appended herein are given as examples and are not limiting to the invention. These are schematic drawings intended to facilitate the understanding of the invention and are not necessarily at the same scale of the practical applications. More particularly, the relative thicknesses of the various layers and films are not a representation of reality.

DETAILED DESCRIPTION OF THE INVENTION

It should be noted that, within the scope of the present invention, the words "on", "over" or "underlying" or the equivalents thereof do not necessarily mean "in contact with". Thus, for instance, depositing a first layer on a second layer does not necessarily mean that the two layers are directly in contact with each other, but this means that the first layer at least partially covers the second layer by being either directly in contact therewith or by being separated therefrom by another layer or another element.

In the following description, thickness is generally measured in directions perpendicular to the plane of the lower face of the layer to be etched or of a substrate whereon the lower layer has been deposited. Thickness is thus generally measured along a vertical direction in the figures shown. On the contrary, the thickness of a layer covering a flank of a pattern is measured along a direction perpendicular to such flank.

The invention will now be described in greater details while referring to FIGS. 5 to 11b.

Figure 5:
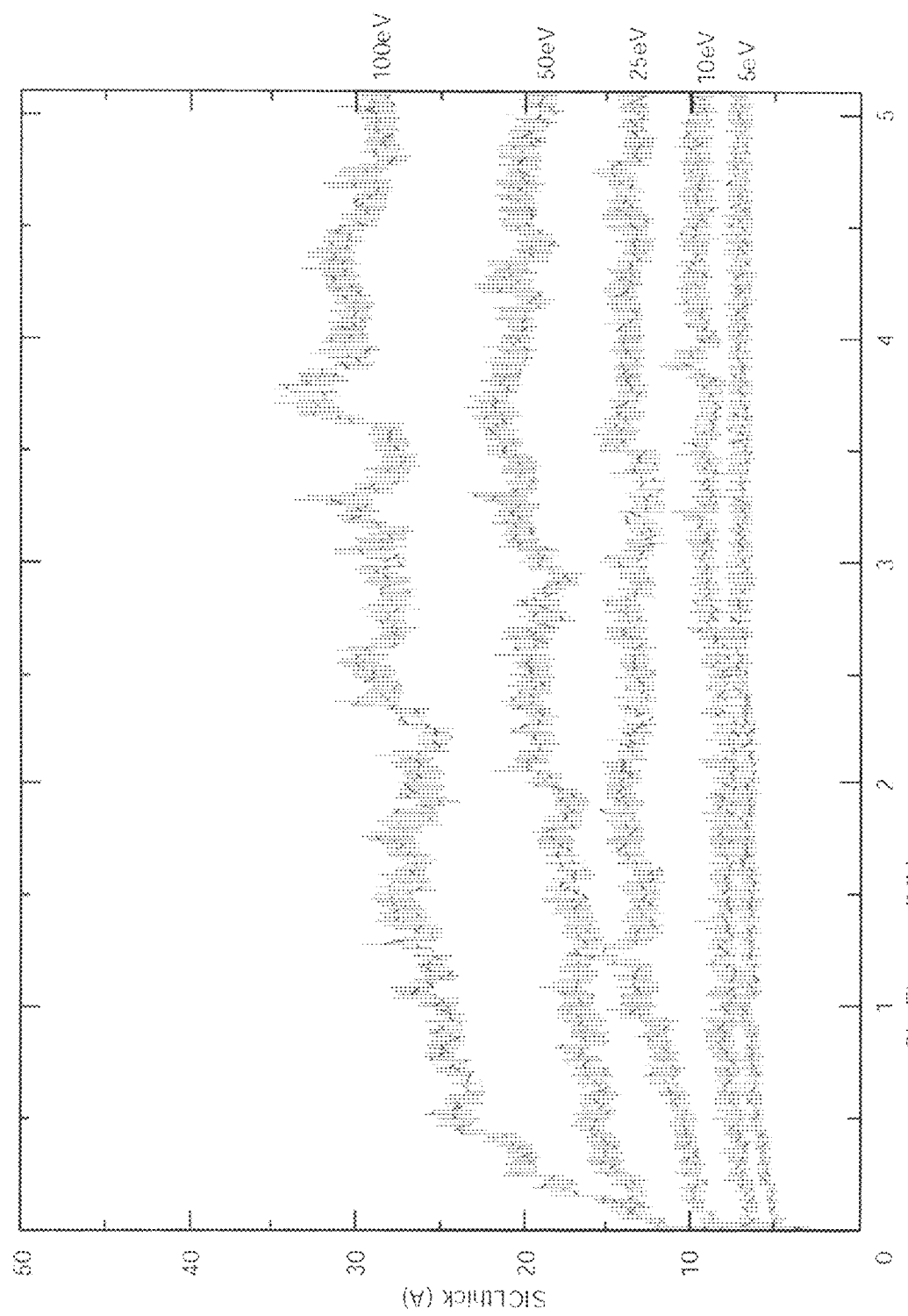
FIG. 5 (atomistic simulation) illustrates the forming of the reactive layer as a function of fluence in plasma comprising Cl radicals and Cl+ ions for various ion bombardment energies.

The invention is partly based on the observation of the dynamics of the forming of the reactive layer which is illustrated in a first example of FIG. 5.

It should be reminded here that the reactive layer is formed by a portion of the layer to be etched which is disturbed by the synergy between the ion bombardment and the radicals of the reactive gas plasma during the plasma etching. The thickness and the composition of the reactive layer depend on the plasma excitation parameters (pressure, gas flow and gas nature, ion energy, plasma density, photon flux). In a first approximation, the quantities which play a part in the forming of the reactive layer are: the density of the ions bombarding the substrate, the energy of the ions bombarding the substrate, the flux of atomic and molecular radicals bombarding the substrate, the flux of photons bombarding the substrate and the temperature of the substrate. The forming, the thickness and the chemical composition of the reactive layer thus mainly depend on the flux of species which reach the substrate and on the synergy between such parameters.

When it has reached a steady state thickness, i.e. a thickness that is steady over time, the reactive layer propagates into the material to be etched when and as etching progresses. The reactive layer extends from the surface of the layer to be etched and along the layout direction. The reactive layer is an original layer of material which has been disturbed by the reactive gas plasma. It is made of the original material which is "mixed" with the reactive species of the plasma.

Figure 1:
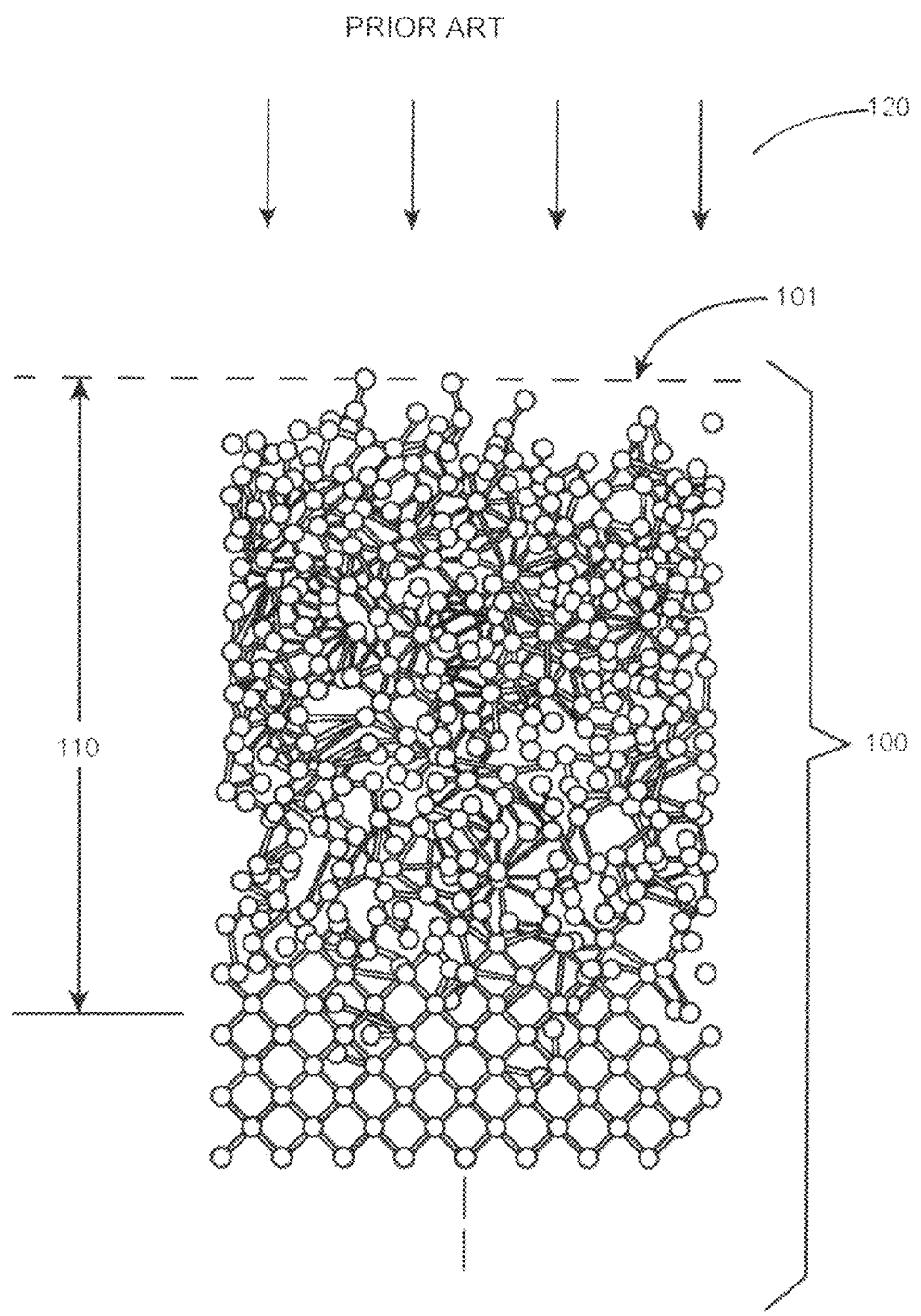
FIG. 1 shows the superficial layer of a material being etched, the atomic structure of which is significantly disturbed by a plasma ion bombardment.
Figure 2A:
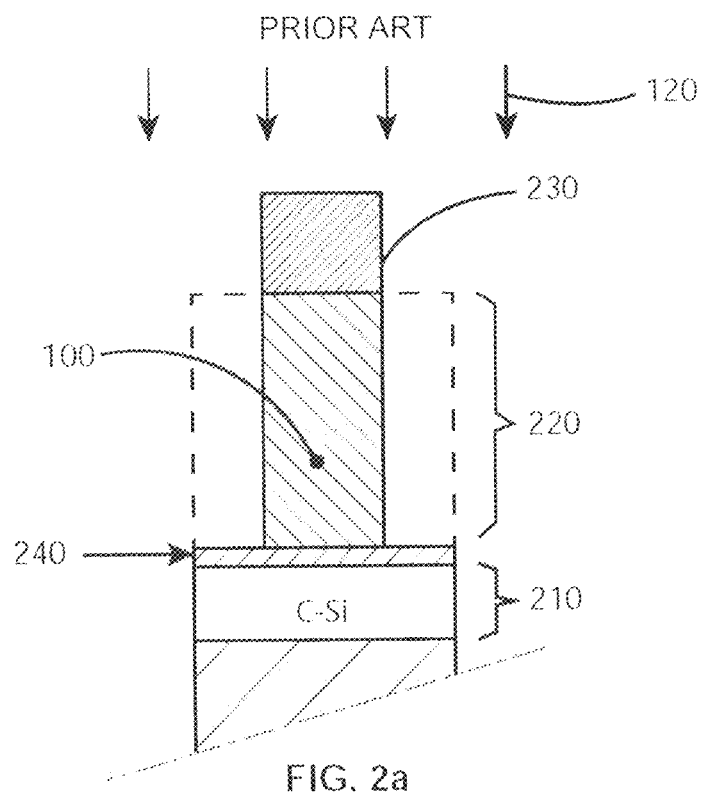
FIGS. 2a to 2e illustrate the problems which arise during the plasma etching of electronic components having decananometric dimensions.
Figure 2B:
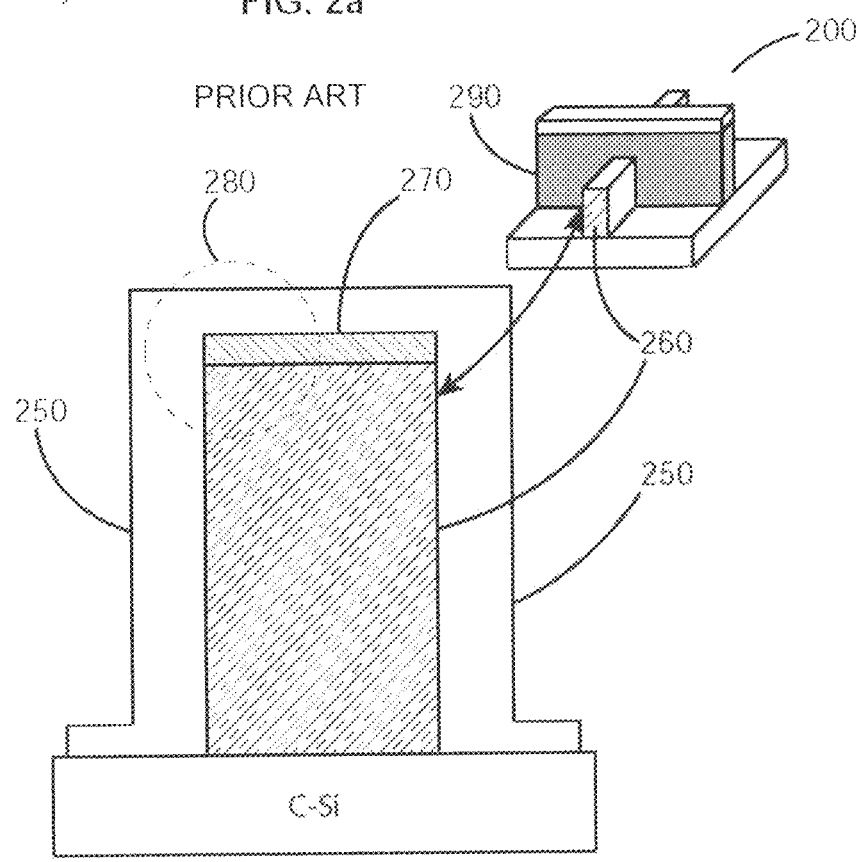
Figure 2C:
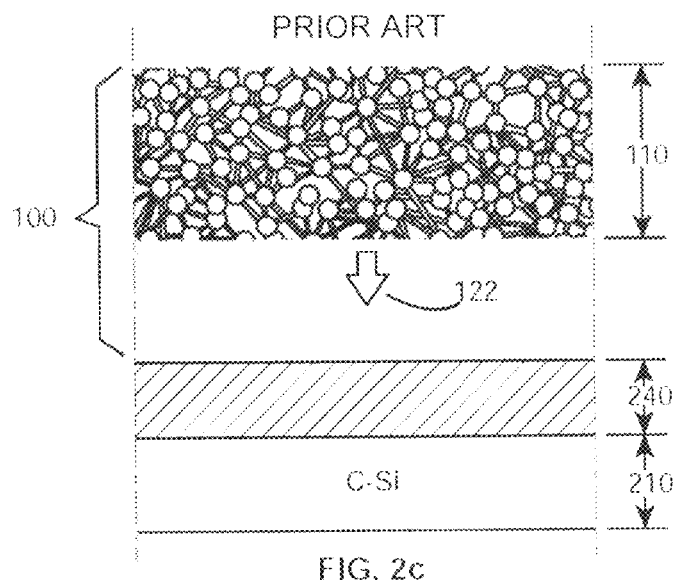
Figure 2D:
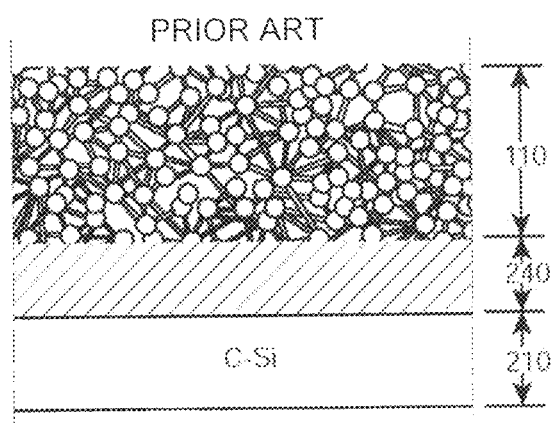
Figure 2E:
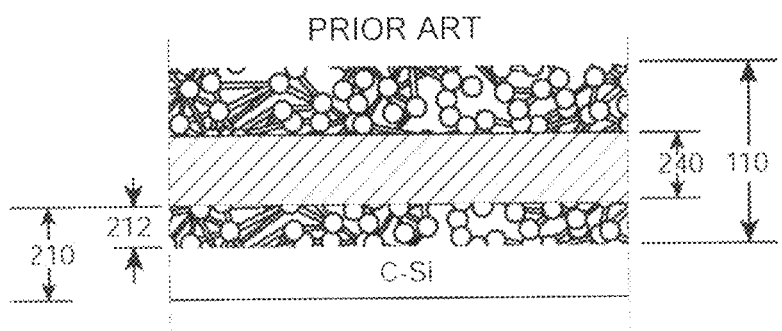

The thickness thereof is measured according to the privileged direction of plasma etching, i.e. according to the privileged direction of the ion bombardment. This direction corresponds to the vertical in FIGS. 2c-2e for example.

The thickness of the reactive layer may typically be measured, in certain cases, by ellipsometry (on models) or by surface analyses of the SPX type (X photoelectrons spectroscopy or still by transmission electron microscopy). Under typical plasma etching conditions, such reactive layer 110 is usually several nanometers thick and may even be a few dozens of nanometers thick.

It can be noted that, in a chlorinated plasma having a density of $5 \times 10^{10}$ ions/cm$^3$ and wherein the ions receive an energy of 50 eV the state of equilibrium of the reactive layer in silicon, i.e. the thickness it reaches when plasma is stabilised (a thickness also called steady state thickness in the present description), is obtained only after about 300 ms of plasma. FIG. 5 illustrates the growth of the reactive layer vs time for various ionic bombardment energies. The axis of ordinates corresponds to the thickness of the layer, in angstroms. The bombardment energy is indicated on the right of each layer. These curves show that the layer reaches its full thickness of 2 nm in this case in about 400 (ms) for an ion energy of 50 eV. Such results are based on atomistic simulations. Such values are given for indication only and give an idea of characteristic times in the case of the simple system wherein the material is silicon and the reactive gas is chlorine. In practice, materials are etched using a mixture of reactive gases.

It has been identified, within the scope of the present invention, that the dynamics of growth of the reactive layer depends on the ion density and energy. As regards density, the time (duration Ds) required for obtaining a stable reactive layer is all the shorter since the ion density is high. The same is true for the ion energy: the higher it is and the shorter the time (duration Ds) required for reaching a stable reactive layer (refer to FIG. 5). It can be seen in FIG. 5 that, if plasma is pure chlorine plasma, the characteristic time for forming the SiClx layer is of the order of 100 ms if the ion density is 1 mA/cm$^2$ and if the ion energy is 100 eV.

The method according to one embodiment of the invention takes advantage of the formation dynamics of the reactive layer disclosed above to control the etching process in order to obtain the desired precision. As has just been seen the dynamic conditions for generating the reactive layer depend on the density of the etching plasma and the energy transmitted to the ions. A control of the injection of gas into the etching chamber for maintaining the reactive layer within a low range of thickness, before it stabilizes at an equilibrium thickness is advantageously added thereto.

Figure 6:
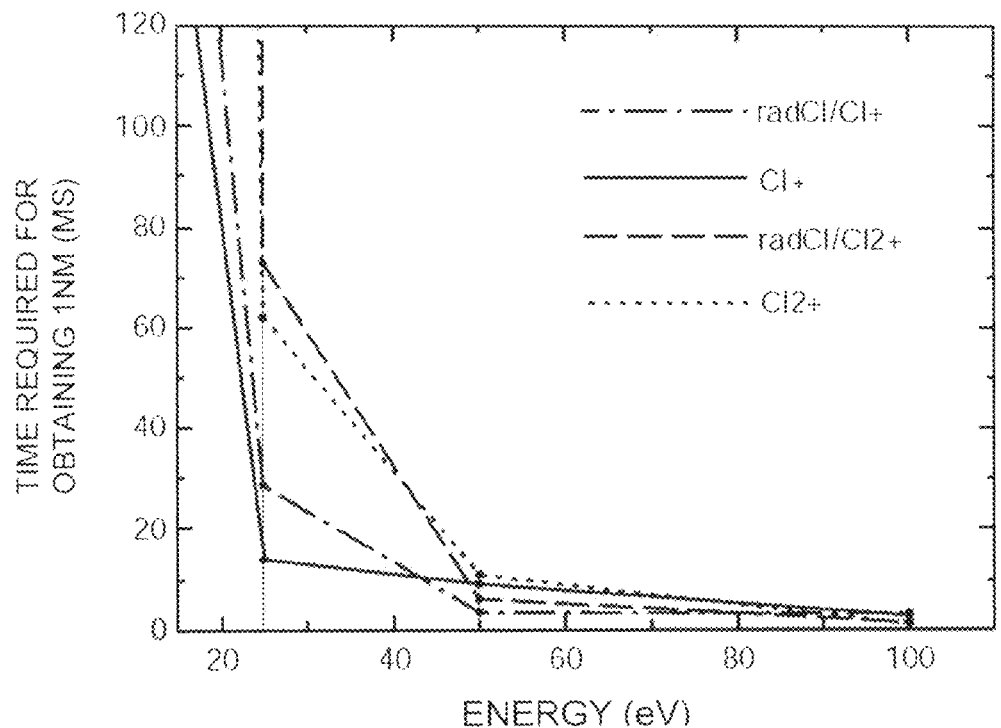
FIG. 6 illustrates the time required (duration Ds) for forming a reactive layer of 1 nm as a function of time and the composition of the reactive gas plasma.

FIG. 6 illustrates the time (duration Ds) required to form a reactive layer of 1 nm in various conditions (Cl+ Ions, Cl radicals+Cl+ ions, Cl2+, ions Cl+ radicals Cl2+ ions). Such results are obtained by an atomistic simulation and show that, for chlorine plasma having an ion density of 1 mA/Cm$^2$ and ions having energy above 50 eV, the time required for generating the reactive layer is short, typically less than 20 ms. To reach times of the order of 100 ms, the Cl+ or Cl2+ ions energy must be less than 25 eV. Such results show that, in the case of the silicon layer to be etched/chlorine for reactive gas couple, a moderate bombardment energy will be necessary to form reactive layers the thickness of which will remain below 1 nm even when controlling the time required for injecting gas into the plasma reactor with a time interval of the order of 100 ms. It can also be noted that the presence of chlorine radicals, when energy ranges from 25 to 50 eV, seems to slow down the forming of the reactive layer.

Figure 7:
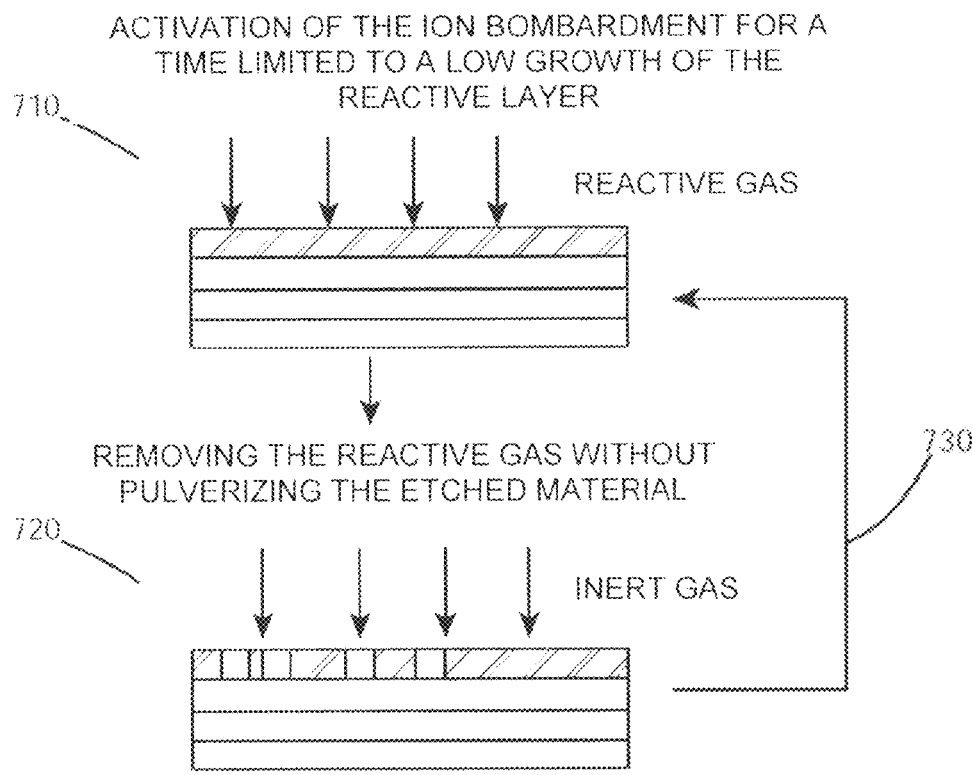
FIG. 7 illustrates the sequence of steps of the method of the invention.

FIG. 7 illustrates the sequence of steps of the method of the invention. During a first step 710 plasma, which is called reactive plasma or etching plasma, is maintained in etching conditions which would typically be those of a continuous etching of the layer to be etched and which would normally result in the forming of a reactive layer of the order of a few manometers as disclosed in the example of FIG. 5. Such conditions however are maintained for a very short time so that the reactive layer can never stabilize and grow beyond a low value, typically of the order of 1 nm. More generally, the etching conditions are maintained for a short enough duration to prevent the reactive layer from reaching a steady state thickness The duration of the injection of the reactive gas during such phase, during which the reactive layer does not have enough time to reach a steady state thickness.

To obtain this result, the injection of the reactive gas like chlorine, in the preceding example, into the etching chamber is controlled. The reactive gas may also be diluted into an inert gas if the gas injection time for which a reactive layer having a thickness of less than 1 nm is too short (typically less than 100 ms). The growth of the reactive layer is stopped by stopping the introduction of gas when the thickness of the layer has reached a predetermined value smaller than the thickness of the reactive layer in a steady state. Typically, the target value is of the order of 1 nm, which enables etching with an atomic accuracy. More generally, such predetermined value is less than 2 nm.

In as short as possible a second step 720, the reactive layer is removed in an inert gas-based plasma which does not react with the material to be etched, so that such inert gas-based plasma causes no pulverization of the material to be etched. Such plasma is called inert plasma. The ions of such plasma have no chemical reaction with the layer to be etched.

Using inert gas makes it possible to physically pulverize the reactive layer during the preceding step without encouraging the forming of the reactive layer. Inert plasma must make it possible to remove the reactive layer without etching the underlying layer or the substrate. The plasma conditions used are thus so selected as to pulverize the reactive layer only without pulverizing the underlying layer or the substrate. As the inert gas plasma does not chemically react with the material of the layer to be etched, it is not used for removing the reactive layer only and thus etching the thickness of the material modified by the reactive layer during the step of injecting the reactive gas during the injection duration D1.

The inert gas is preferably a gas belonging to the group of so-called rare gas in the periodic table (column 18). This is preferably argon (Ar) or Xenon (Xe).

During this second step, the "bias" power applied to the target must be controlled so as to facilitate removing the reactive layer. For example, in the common case where silicon (Si) is etched in a chlorine-based (Cl) reactive plasma, the SiClx single layer formed must be removed without causing the pulverization of the etched material, silicon in this example. For this purpose, the energy transmitted to the inert gas plasma during this second step must remain below a threshold beyond which the etched material would be pulverized.

The sequence of the two above steps must be as quick as possible and repeated 730 until the material to be etched is removed on the whole thickness desired to be etched. Typically, when etching must be stopped on a barrier layer, the sequence of steps 710, 720 is repeated until the material to be etched is completely removed, with etching possibly stopping with an atomic precision.

Figure 8:
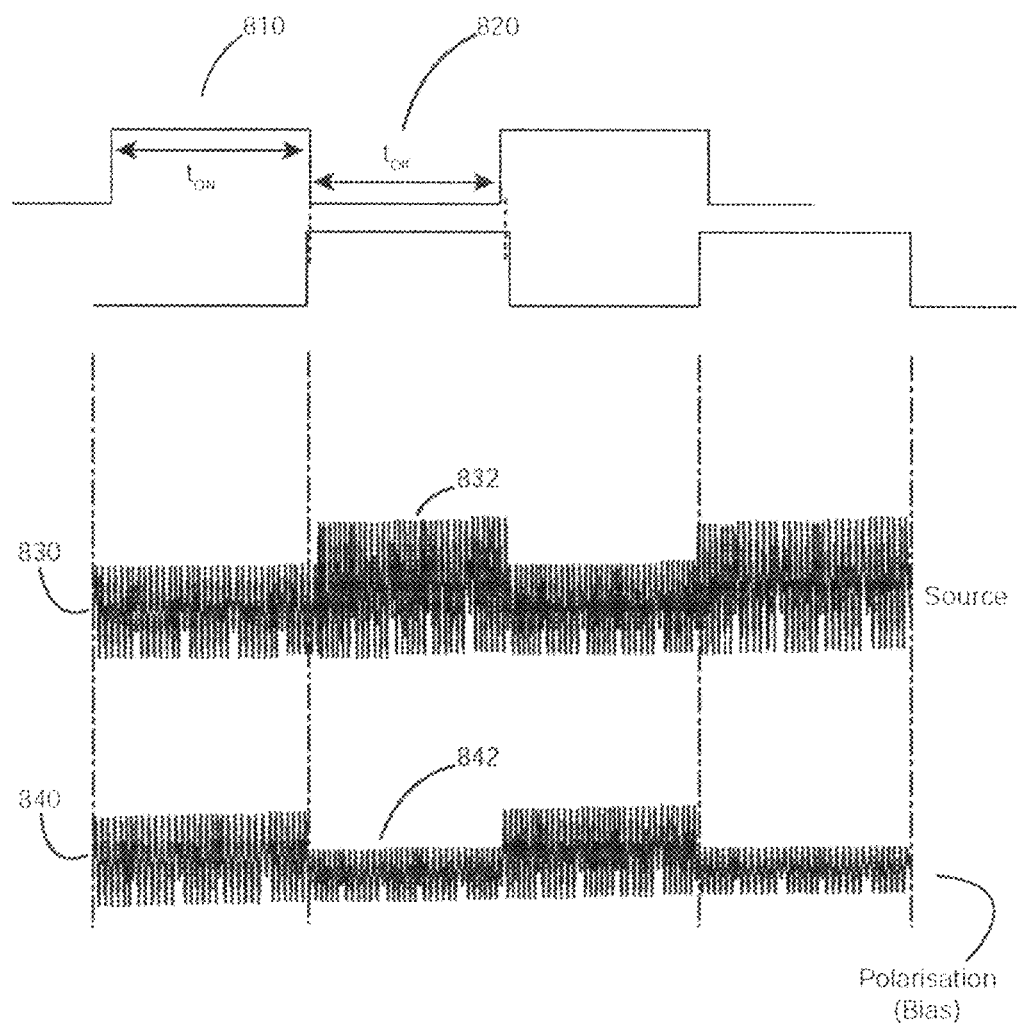
FIG. 8 illustrates the repetition cycle of the steps of the etching method of the invention.

FIG. 8 illustrates the repetition cycle of the above steps. The reactive gas, for instance chlorine, is introduced into the etching reactor during a so-called $t_{ON}$ time 10 ranging from one hundred milliseconds to a few hundreds of milliseconds. When forming the reactive layer, the operating conditions of the etching chamber are those which would be used with a continuous plasma and which would thus lead to the forming of too thick a reactive layer, as already seen. More particularly the power applied to the radiofrequency source (RF) 830 and the one applied to bias 840 are similar to the conditions of etching executed continuously or the bias power may possibly be so reduced as to maintain the ions energy at a value of 50 eV or more probably less than 25 eV.

The inert gas, for instance argon, is introduced into the etching reactor during a so-called $t_{OFF}$ time 820 typically also ranging from one hundred milliseconds to a few hundreds of milliseconds. Meanwhile, the RF power of the source 830 is so adjusted as to be as high as possible 832 so as to produce an inert gas plasma having a very high density so as to shorten such step by eliminating the reactive layer which has been formed during the preceding step as quickly as possible. At the same time, the bias power 842 is so adjusted as to maintain the ions energy below the pulverization threshold, typically above a 20 eV energy.

To summarize the step 710 of forming the reactive layer is executed under the following conditions:
  The simplest approach to form the reactive layer consists in using parameters for the formation of the reactive gas plasma identical with those used in a standard continuous etching mode and stopping the injection of the reactive gas when a layer of the order of 1 nm or less has been formed on the material to be etched. The injection of the reactive gas is typically executed within a time (duration D1) between 100 and 500 ms. If so required, the ion energy can be so adjusted (reduced) as to keep the thickness of the layer at a thickness of less than 1 nm
  The source power can be maintained constant if by reducing the gas injection time within the range of 100 ms or more, an ultra-thin reactive layer of 1 nm or less can be formed. If the gas injection time must be less than 100 ms the density of the reactive gas plasma can be reduced.
  Reducing plasma density increases the time required for reaching the state of equilibrium of the reactive layer. Consequently, the reactive gas injection time for which a thickness of 1 nm of the reactive layer is obtained also increases.

The R.F («bias») power which controls the energy transmitted to the ions, can be maintained constant if the time required for injecting reactive gas is not less than 100 ms so as to limit the thickness of the reactive layer to a thickness of less than 1 nm. If this is not the case, the reduction in the energy transmitted to the ions through bias is an efficient means for slowing down the reactive layer forming velocity. The ion energy is the most efficient parameter to slow down the reactive layer forming velocity. A maximum reduction of the energy transmitted to the ions is possible if no bias is applied onto the substrate. In this case, the ion energy is eVp (with Vp being the potential of plasma) and does not, in general, exceed 20 eV in inductive coupling plasma. A pulse of the source power of plasma with a low duty cycle enables an even more important reduction in the energy transmitted to the ions if necessary.

Figure 9:
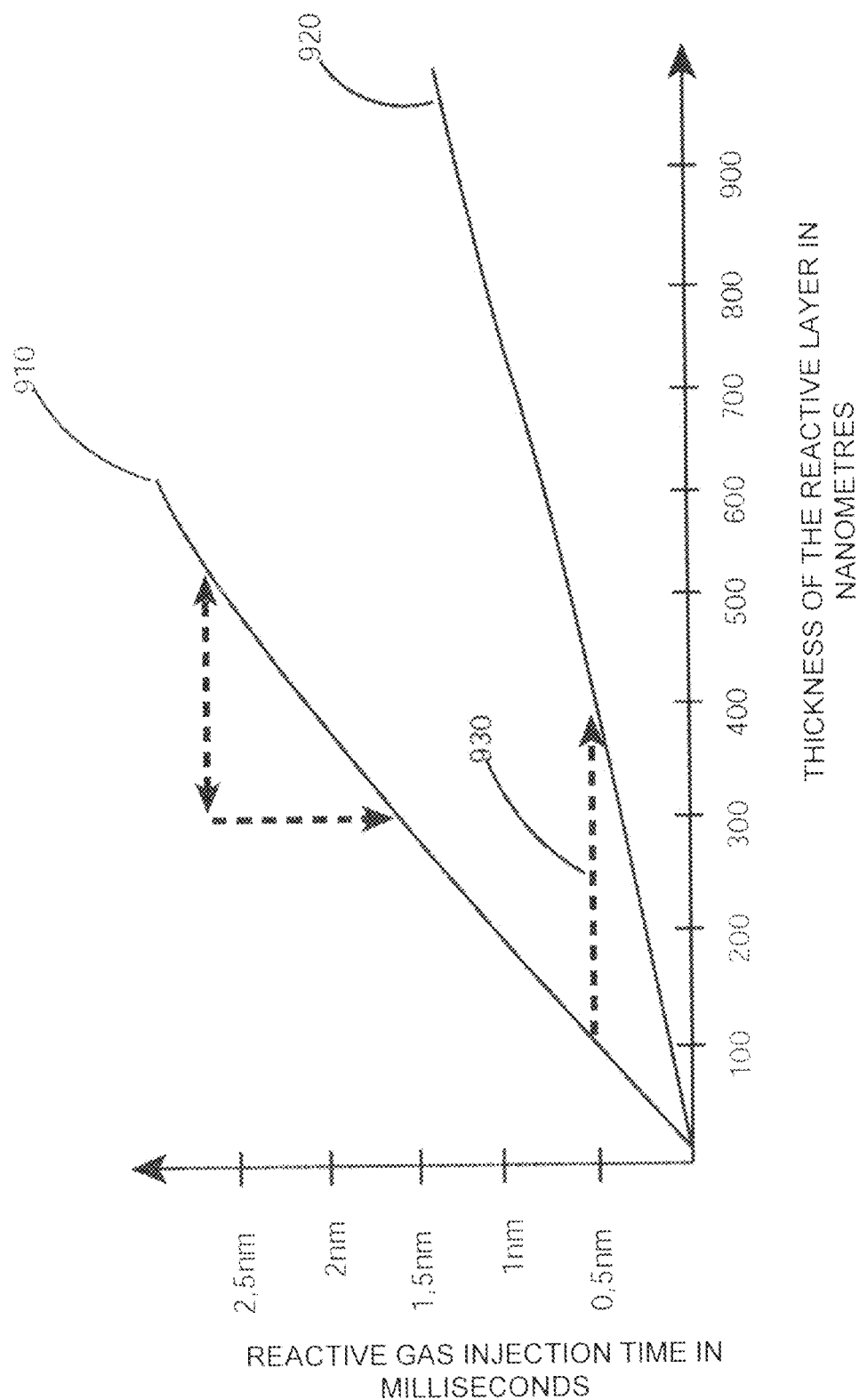
FIG. 9 illustrates the dynamics of growth of the reactive layer versus the time required for injecting the reactive gas and shows the influence of the energy transmitted to the ions.

The diagram in FIG. 9 also illustrates the dynamics of growth of the reactive layer versus the time required for injecting the reactive gas and shows the influence of the energy transmitted to the ions. Curves 910 and 920 correspond to different values of energy. The growth of the reactive layer slows down when the energy transmitted to the ions decreases 930.

FIG. 9 illustrates the most efficient means available for obtaining, during the first step 710 the desired thickness for the reactive layer: the reactive gas injection time, the energy communicated to the ions. Another means could be varying the density of plasma. This parameter would however significantly modify the gaseous phase of plasma, which is not desired so as to remain as close to the optimized method as possible in continuous plasma conditions (without injection of gas controlled over time).

As regards the second step 720 of the method, which is preferably executed in an inert gas plasma formed from a rare gas, for instance argon (Ar) or xenon (Xe), such step must be so adjusted as to enable a quick removal of the reactive layer which has been formed during the preceding step 710.

During this step, the energy transmitted to the ions must be such as to enable the pulverization of the reactive layer formed during the first step. This concerns, when etching silicon (Si) in chlorine (Cl)-based plasma for instance, SiClx compounds. Besides, the energy transmitted to the ions must remain below the pulverization threshold of the material to be etched, silicon in this example. In argon-based plasma and for etching silicon, the energy transmitted to the ions will have to be less than 30 eV and if possible less than 20 eV.

Besides, during the second step 720, the plasma using an inert gas, for example argon, can operate continuously. Such step must be as quick as possible and the continuous mode must be preferably used with a high source power, typically above 500 W. A bias power may be applied to the wafer if the ion energy is maintained below the silicon pulverization threshold or that of any other material whereon etching must stop.

In order to limit the depth of the amorphization induced by the plasma in silicon, and in the other etched materials, in general, the ion energy must remain below 30 eV and preferably below 20 eV. In this case, the amorphization depth is limited, for silicon, to values of less than 1 nm.

Very high RF source powers, above 1,000 watts in 300 mm inductive coupling reactors generate very high density rare gas (argon, xenon) plasma within a range from $10^{11}$ to $10^{12}$. The so-called VUV light, the acronym for «vacuum UV» which corresponds to an ultra violet radiation with a short wavelength, generated by such inert plasma also contributes to etching. The increase in the source power thus not only helps obtain very high ion densities, but also favours the production of a very important flow of VUV light which contributes to the elimination of the reactive layer formed during the first step.

Figure 10:
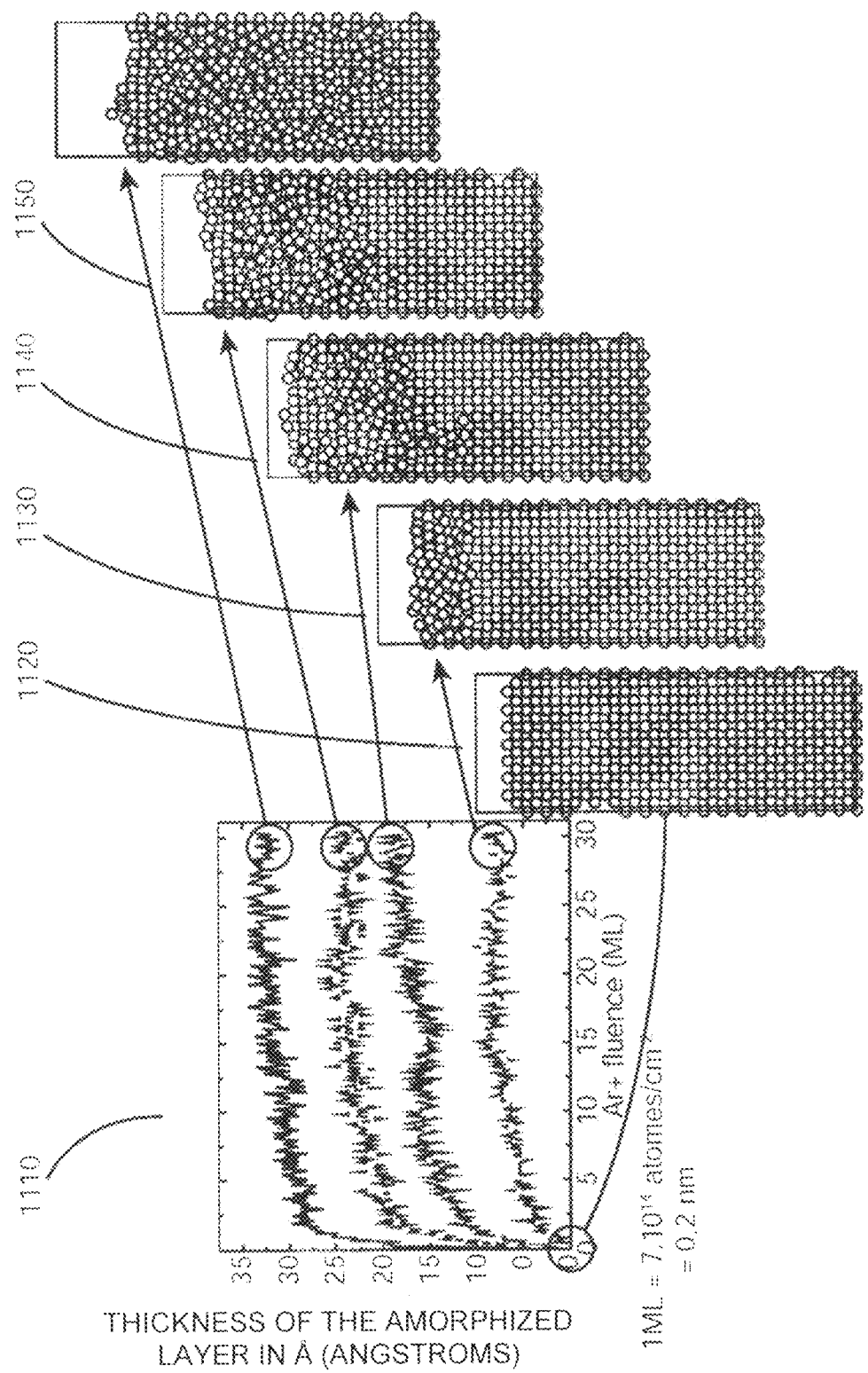
FIG. 10 illustrates the amorphization of the material underlying the one being etched upon stopping thereof.

FIG. 10 illustrates the amorphization of the material underlying the one being etched upon stopping of the operation. FIG. 10 relates to silicon. It shows that the amorphization of such material becomes too important when the ion energy exceeds the range of values between 20 and 30 eV.

Diagram 1110 shows the thicknesses of silicon made amorphous according to the fluence of the argon ions used in this example and for various energies transmitted to such ions including the following values: 20 eV 1120; 50 eV 1130; 100 eV 1140 and 200 eV 1150. The resulting amorphous thickness grows when the energy transmitted to the ions increases.

Figure 11A:
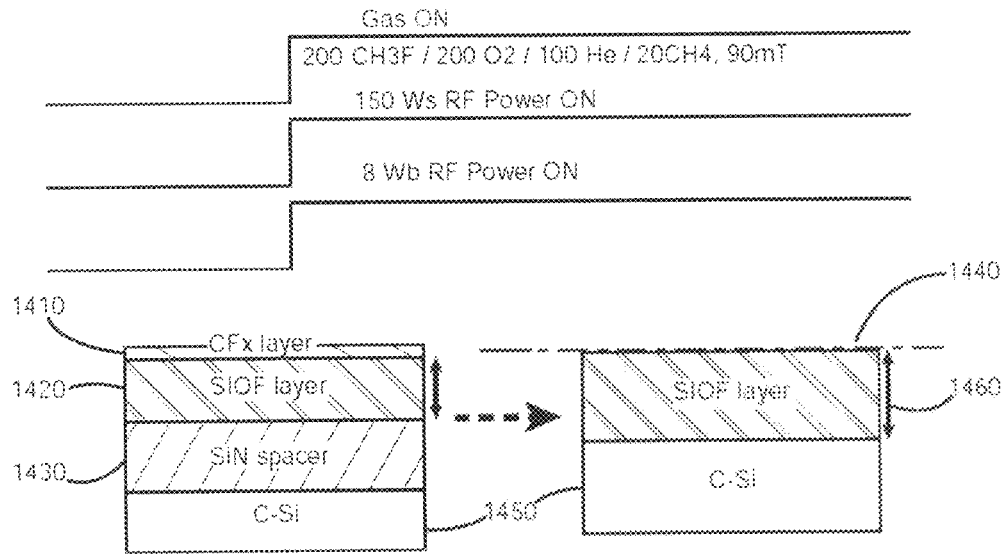
FIGS. 11a and 11b compare the standard method for etching nitride spacers in MOSFET transistors and the method of the invention applied to this case.
Figure 11B:
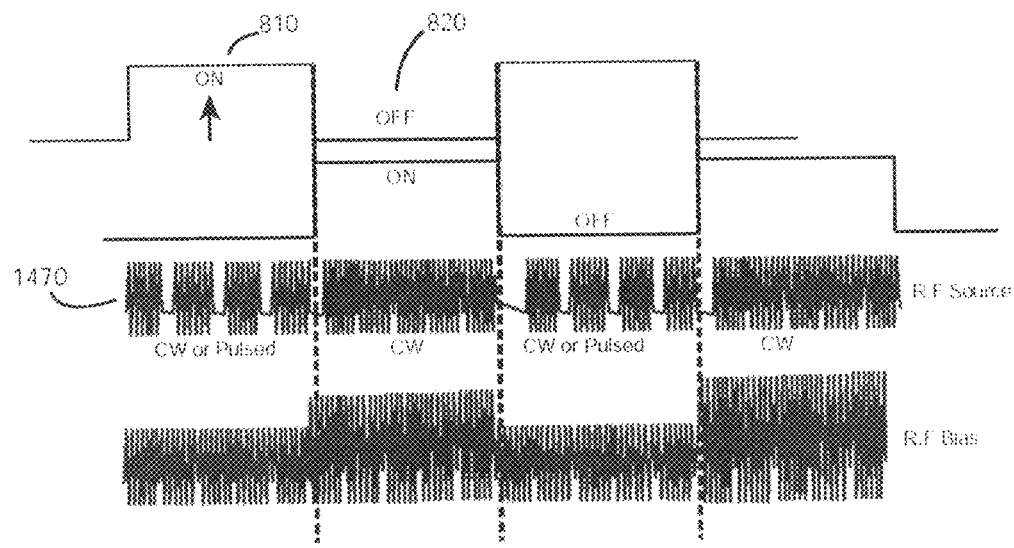
Figure 11B:
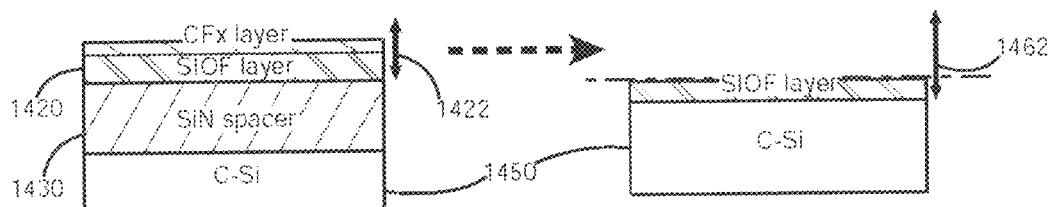

FIGS. 11a and 11b compare the standard method for etching nitride spacers in MOSFET transistors and the method of the invention applied to this case.

FIG. 11a illustrates the prior art wherein etching is executed in an etching chamber of the ICP type using trifluoromethane (CHF3)-based fluorocarbon plasma with the application of a source power of 150 watts and a bias power of 8 watts. Such conditions are maintained for the whole duration of the etching. It can be seen that a thin layer of fluorocarbon (CFx) 1410 and a thick layer of fluorine-doped silicon oxide (SiOF) 1420 are formed, which form the reactive layer which propagates during etching into the layer of silicon nitride (SiN) 1430 intended to form the spacers.

Figure 3:
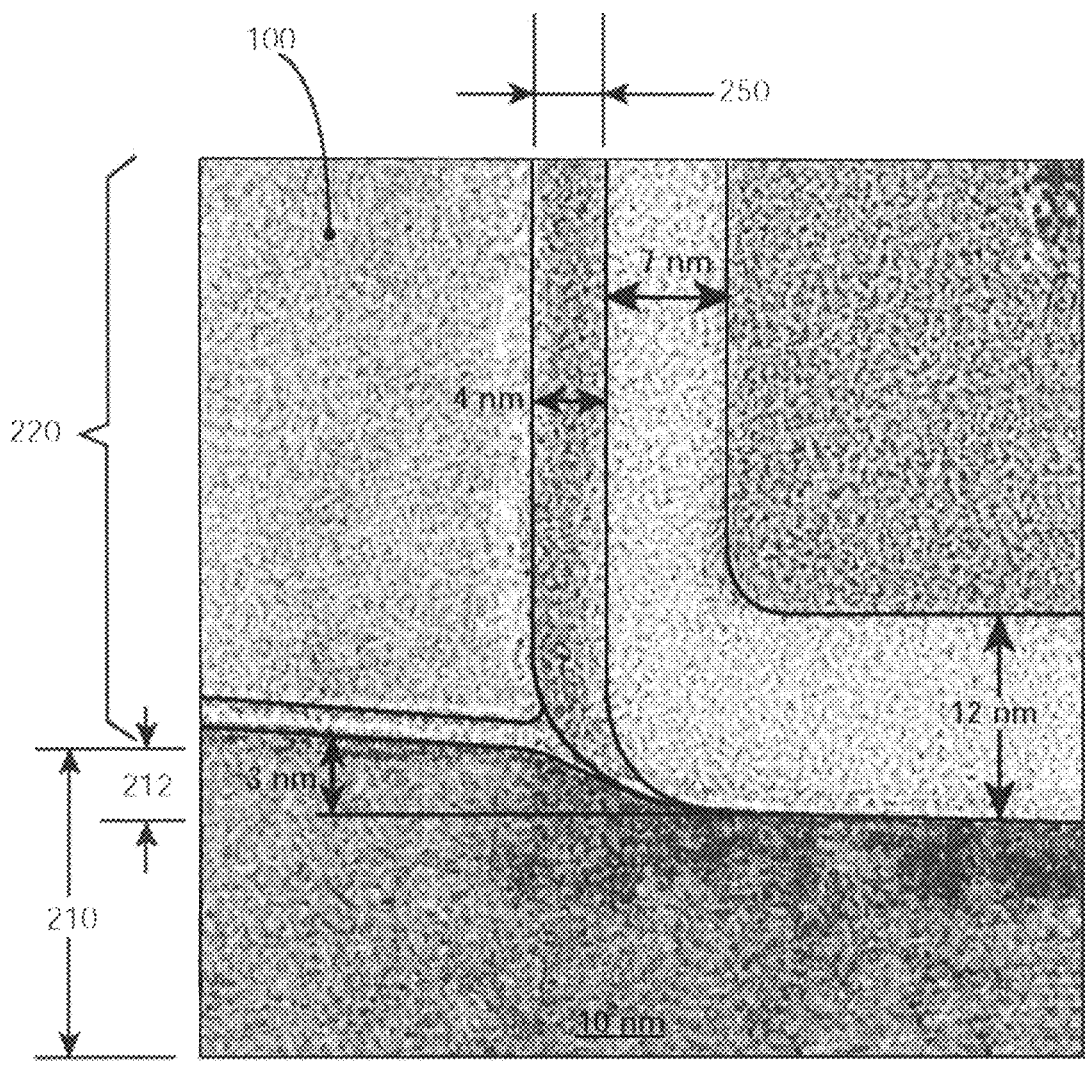
FIG. 3 is a picture of a section of a transistor of the FDSOI type etched using standard plasma etching.
Figure 4A:
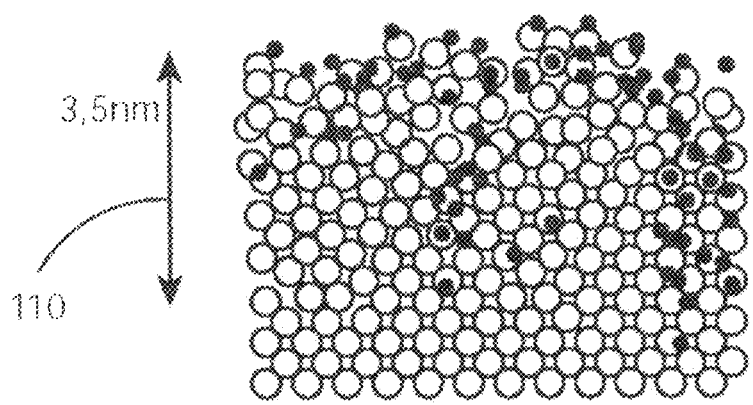
FIGS. 4a and 4b illustrate a target for the reduction in the thickness of the reactive layer to be aimed at to give the etching method the properties required for actually obtaining a sufficiently accurate etching for the decananometric technological nodes.
Figure 4B:
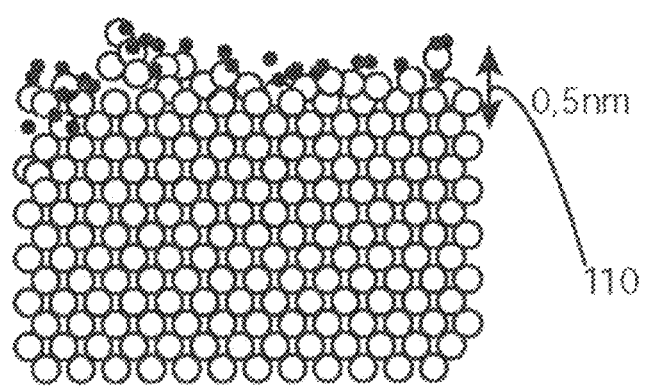

Upon completion of etching 1440, which always comprises over-etching time to take account of the thickness dispersions on the wafer and to ensure the complete etching of three-dimensional patterns, the reactive layer is eventually transferred into the underlying material, i.e. into crystalline silicon 1450 which, in this case, is then oxidized 1460 on a high thickness, with the drawbacks mentioned above in FIG. 3 which is disclosed in the section dealing with the state of the art.

FIG. 11b illustrates the method of the invention wherein, as described above, the injection of a reactive gas 810 alternates with the injection of an inert gas 820.

The reactive gas plasma formed during the injection of the reactive gas is typically, as in the prior art described in FIG. 11a, trifluoromethane-based (CHF3) fluorocarbon plasma. As already mentioned above, in the phase during which the reactive gas is introduced, plasma can operate in pulsed synchronized mode (the source power and the bias power are pulsed in synchronism) or continuously. When working is in pulsed synchronized mode, the pulse frequency typically ranges from 1,000 hertz to 5 kilohertz. The duty cycle thereof ranges from 10 to 100% and the RF power delivered at the source ranges from 100 to 2,500 watts. During this phase, the bias power may be null. It is generally low and ranges from 0 to 75 watts.

During the phase 820 during which a rare gas, for instance argon, is introduced, the source power is still applied continuously whereas the bias power is optimized while remaining below the silicon pulverization threshold, however, so as to eliminate the reactive layer as quickly as possible.

In such conditions the SiOF layer 1420 formed during the phase 810 is very thin 1422, which results in a very low oxidation 1462 of the underlying silicon upon completion of the etching of the nitride layer 1430.

To summarize an embodiment disclosed above, an etching method according to the invention comprises:

an initial phase comprising:
at least one initial step of etching, with the initial step of etching comprising, for a duration D0, an injection into the reactor of at least one reactive gas to form a reactive gas plasma, with the reactive gas plasma forming, together with the layer to be etched, a reactive layer 110 which goes into the layer to be etched, with the duration D0 being longer than a determined duration Ds of injection, upon completion of which the reactive layer 110 reaches a steady state thickness, so that the thickness of the reactive layer 110 can reach said steady state thickness during said initial step of etching;

at least one step of removing the reactive layer 110, formed upon completion of the initial step of etching;

with the method comprising, after the initial phase, a subsequent phase including at least a sequence of steps, with each sequence including at least the following steps:

for a duration D1, an injection 710 into the reactor of at least one reactive gas to form a reactive gas plasma, with the reactive gas plasma forming, together with the layer to be etched, a reactive layer 110 which goes into the layer to be etched, with the duration D1 of injection being shorter than the determined duration Ds of injection upon completion of which the reactive layer 110 would reach a steady state thickness, so that, during the subsequent phase, the thickness of the reactive layer 110 remains smaller than said steady state thickness;

at least one step of removing 720 the reactive layer 110, formed upon completion of the injection performed during the duration D1, with the removing step 720 comprising injecting at least one inert gas into the reactor to form an inert gas plasma making it possible to remove the reactive layer 110 only, formed upon completion of the injection performed during the duration D1.

The initial phase thus makes it possible to quickly etch the layer to be etched and the subsequent phase of etching is triggered when the thickness of the layer to be etched is reduced and when the free face of the layer to be etched gets close to the underlying layer. The subsequent phase is started soon enough for the underlying layer not to be affected by the reactive layer. If the underlying layer is made of single-crystal silicon, the single-crystal silicon underlying layer will not be undesirably be etched.

The method thus enables an improved accuracy while ensuring a sufficiently high speed to be industrialized.

Optionally but advantageously, the layer to be etched lies over an underlying layer, and the initial phase is interrupted and the subsequent phase is started when the layer to be etched has a thickness greater than the steady state thickness of the layer and smaller than k times the steady state thickness of the layer.

The thickness of the layer to be etched comprises the thickness of the reactive layer. Such thickness is measured perpendicularly to the main plane, wherein the layer to be etched and the underlying layer extend, i.e. vertically in FIGS. 11*a*, 11*b*.

The initial step of etching is thus stopped before the reactive layer reaches a sufficient thickness to disturb the underlying layer. As a matter of fact, during the subsequent phase, the thickness of the reactive layer is smaller than the steady state thickness. The stoppage of the etching is thus precisely controlled and any interference of the reactive layer with the underlying layer is thus avoided. The latter is thus preserved.

The initial phase thus makes it possible to quickly etch the layer to be etched and the subsequent phase of etching is triggered when the thickness of the layer to be etched is reduced and when the free face of the layer to be etched gets close to the underlying layer. The subsequent phase is started soon enough for the underlying layer not to be affected.

According to one embodiment, k ranges from 8 to 2, preferably k ranges from 6 to 3 and preferably k=4. This enables a high velocity of the method while reducing the risk of damaging the underlying layer.

As is clear from the previous description, the invention thus makes it possible to significantly reduce the thickness of the removed layer or at least to precisely control the stopping of the etching, for instance, in silicon, and thus reduce the consumption thereof. Depending on the parameters used, it makes it possible to remove, in particular, a thickness of less than 1.5 nm, or even less than 0.5 nm for a control of the etching which may reach an atomic accuracy.

The invention is not limited to the embodiments described thereabove only but applies to any embodiment within the scope of the claims.

The invention claimed is:

1. A method for etching in a plasma etching reactor, comprising:
    performing at least one first phase, comprising:
        injecting at least one reactive gas into the plasma etching reactor for a duration D0 to form a reactive gas plasma,
        forming a reactive layer into a material from the reactive gas plasma and the material,
        the duration D0 being longer than a predetermined duration Ds for which the formed reactive layer reaches a steady state thickness, and
        removing the formed reactive layer by etching; and
    performing at least one second phase, comprising:
        injecting the at least one reactive gas into the plasma etching reactor for a duration D1 to form the reactive gas plasma,
        forming another reactive layer into the material from the reactive gas plasma and the material,
        the duration D1 being shorter than the predetermined duration Ds such that the formed another reactive layer has a thickness that is less than the steady state thickness, and
        removing the formed another reactive layer after completion of the duration D1 by injecting at least one inert gas into the plasma etching reactor to form an inert gas plasma, and without removing the material below the thickness of the formed another reactive layer.

2. The method according to claim 1, further comprising performing a plurality of iterations of the at least one second phase.

3. The method according to claim 2, wherein the at least one reactive gas injected during an iteration of the second phase is different from the at least one reactive gas injected during another iteration of the second phase.

4. The method according to claim 2, wherein the at least one inert gas injected during an iteration of the second phase is different from the at least one inert gas injected during another iteration of the second phase.

5. The method according to claim 1,
    wherein the material is disposed on top of an underlying layer, and
    wherein the at least one first phase is interrupted and the at least one second phase is started when the formed reactive layer has a thickness greater than the steady state thickness.

6. The method according to claim 5, wherein the at least one first phase is interrupted and the at least one second phase is started when the thickness greater than the steady state thickness is smaller than k times the steady state thickness, where k is a number ranging from 2 to 8.

7. The method according to claim 6, wherein k ranges from 3 to 6.

8. The method according to claim 7, wherein k=4.

9. The method according to claim 1, wherein the duration D1 ranges from 50 ms to 500 ms.

10. The method according to claim 1, wherein the injecting for the duration D1 is interrupted when the formed another reactive layer has a thickness smaller than 2 nm.

11. The method according to claim 1, wherein the injecting for the duration D1 is interrupted when the formed another reactive layer has a thickness smaller than 1 nm.

12. The method according to claim 1,
wherein the material is disposed on top of a barrier layer, and
the injecting for the duration D1 is interrupted before the formed another reactive layer has a thickness greater than a thickness of the barrier layer.

13. The method according to claim 1, wherein a duration of the injecting of the inert gas ranges from 50 ms to 500 ms.

14. The method according to claim 1, wherein a duration of the injecting of the inert gas ranges from 100 ms to 500 ms.

15. The method according to claim 1, further comprising, during the forming of the another reactive layer, adjusting at least one of the following parameters to control the forming of the another reactive layer: the duration D1 of the injecting of the at least one reactive gas, and an energy transmitted to ions in the reactive gas plasma.

16. The method according to claim 1, further comprising, during the at least one second phase, transmitting energy to ions in the reactive gas plasma at less than 50 eV, wherein a density of the reactive gas plasma ranges from $10^{10}$ ions/cm$^3$ to $5>10^{10}$ ions/cm$^3$.

17. The method according to claim 1, further comprising, during the at least one second phase, transmitting energy to ions in the reactive gas plasma at less than 25 eV, wherein a density of the reactive gas plasma ranges from $10^{10}$ ions/cm$^3$ to $10^{11}$ ions/cm$^3$.

18. The method according to claim 1, further comprising, during the removing the formed another reactive layer, adjusting at least one of the following parameters to control the removing of the formed another reactive layer without removing the material below the thickness of the formed another reactive layer: a duration of the injecting of the inert gas, a density of the inert gas plasma, and an energy transmitted to ions of the inert gas plasma.

19. The method according to claim 1, further comprising, during the at least one second phase, transmitting energy to ions of the inert gas plasma at less than 50 eV.

20. The method according to claim 1, further comprising, during the at least one second phase, transmitting energy to ions of the inert gas plasma at less than 25 eV.

21. The method according to claim 1, wherein during the at least one second phase, the inert gas plasma is a pulsed plasma and an energy transmitted to ions of the inert gas plasma is less than 50 eV.

22. The method according to claim 1, wherein during the at least one second phase, the inert gas plasma is a pulsed plasma and an energy transmitted to ions of the inert gas plasma is less than 25 eV.

23. The method according to claim 1, further comprising electrically polarizing the material or a substrate supporting the material.

24. The method according to claim 1, further comprising, during the forming of the another reactive layer, injecting the at least one inert gas in addition to the injecting of the at least one reactive gas.

25. The method according to claim 1, wherein the at least one reactive gas is selected from among a first group of $Cl_2$, $HBr$, $SF_6$, $NF_3$, $SiCl_4$, $BCl_3$, $H_2$, $SiF_4$, $O_2$, $HCl$, $HI$, $CH_2F_2$, $CHF_3$, and $Ar$, or is selected from among a second group of $CF_4$, $CHF_3$, $CH_3F$, $C_4F_8$, $CH_2F_2$, $C_5F_6$, $Ar$, $O_2$, and $He$, or is selected from a mixture of gases from the first group and the second group.

26. The method according to claim 1, wherein the at least one inert gas is a rare gas or a mixture of rare gases.

27. The method according to claim 1, wherein the at least one inert gas is Ar, Xe, or a mixture of Ar and Xe.

28. The method according to claim 1, wherein during the removing the formed another reactive layer, the injecting the at least one inert gas into the plasma etching reactor is executed continuously and simultaneously with a plurality of injections of the at least one reactive gas.

29. The method according to claim 1, wherein the material is a semiconductor material selected from among: silicon, germanium, silicon-germanium, a III-V material, a metal, or a porous dielectric material.

30. The method according to claim 1, wherein the material is a layer of a MOSFET transistor.

31. A system for implementing a method for etching according to claim 1, the system comprising:
at least one plasma etching reactor; and
at least one injector configured to inject at least two gases into the at least one plasma etching reactor for the duration D1.

32. A method for etching in a plasma etching reactor, comprising:
injecting at least one reactive gas into the plasma etching reactor for a duration D0 to form a reactive gas plasma;
forming a reactive layer into a material from the reactive gas plasma and the material,
the duration D0 being longer than a predetermined duration Ds for which the formed reactive layer reaches a steady state thickness;
removing the formed reactive layer by etching;
injecting the at least one reactive gas into the plasma etching reactor for a duration D1 that is less than 1,000 ms to form the reactive gas plasma;
forming another reactive layer from the reactive gas plasma on a surface of the material; and
removing the formed another reactive layer by injecting at least one inert gas into the plasma etching reactor to form an inert gas plasma.

* * * * *